United States Patent
Lim et al.

(10) Patent No.: US 8,046,186 B2
(45) Date of Patent: Oct. 25, 2011

(54) METHOD AND SYSTEM FOR TUNING PRECISION CONTINUOUS-TIME FILTERS

(75) Inventors: Wei Tjan Lim, Fort Collins, CO (US);
Ricky Bitting, Fort Collins, CO (US);
David Noeldner, Fort Collins, CO (US);
Michael Buehner, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 517 days.

(21) Appl. No.: 12/337,830

(22) Filed: Dec. 18, 2008

(65) Prior Publication Data

US 2010/0156525 A1    Jun. 24, 2010

(51) Int. Cl.
*G06F 19/00* (2011.01)
(52) U.S. Cl. ...................................................... 702/107
(58) Field of Classification Search .................. 702/107, 702/182–185
See application file for complete search history.

(56) References Cited

U.S. PATENT DOCUMENTS

| 5,608,400 | A * | 3/1997 | Pellon | 341/143 |
| 2011/0095927 | A1 * | 4/2011 | Pagnanelli | 341/166 |

OTHER PUBLICATIONS

Stehr, et al.; Fully Differential CMOS Integrated 4th Order Reconfigurable Gm-C Lowpass Filter for Mobile Communication; Proceedings of 2003 10th IEEE International Conference on Electronics, Circuits. & Systems.; Dec. 14-17, 2003; pp. 144-147; vol. 1; USA.

* cited by examiner

*Primary Examiner* — Edward Raymond

(57) ABSTRACT

Described embodiments provide a method for calibrating a continuous-time filter having at least one adjustable parameter. A square-wave signal is filtered by a continuous-time filter having a cutoff frequency less than fs. The filtered signal is quantized at the rate fs. An N-point Fourier transform is performed of the quantized signal into N real output values and N imaginary output values. At least one of the real output values are accumulated to form a real output signal and at least one of the imaginary output values are accumulated to form an imaginary output signal. The real and imaginary output signals are summed to form an output signal, which is then squared. The squared output signal is compared to a comparison value. At least one parameter of the continuous-time filter is adjusted based upon the comparison. The steps are repeated until the squared output signal is approximately the comparison value.

20 Claims, 7 Drawing Sheets

100

108

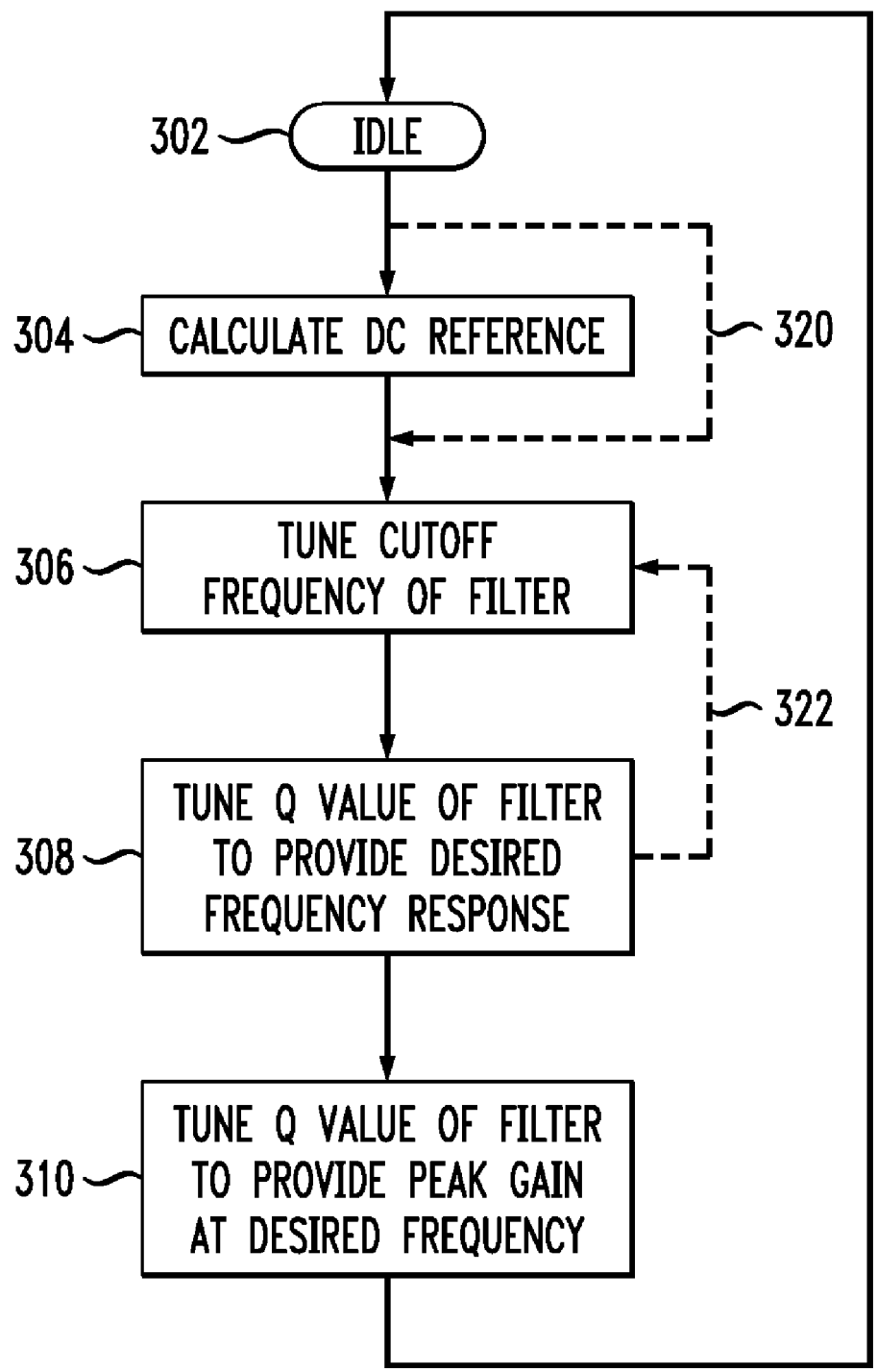

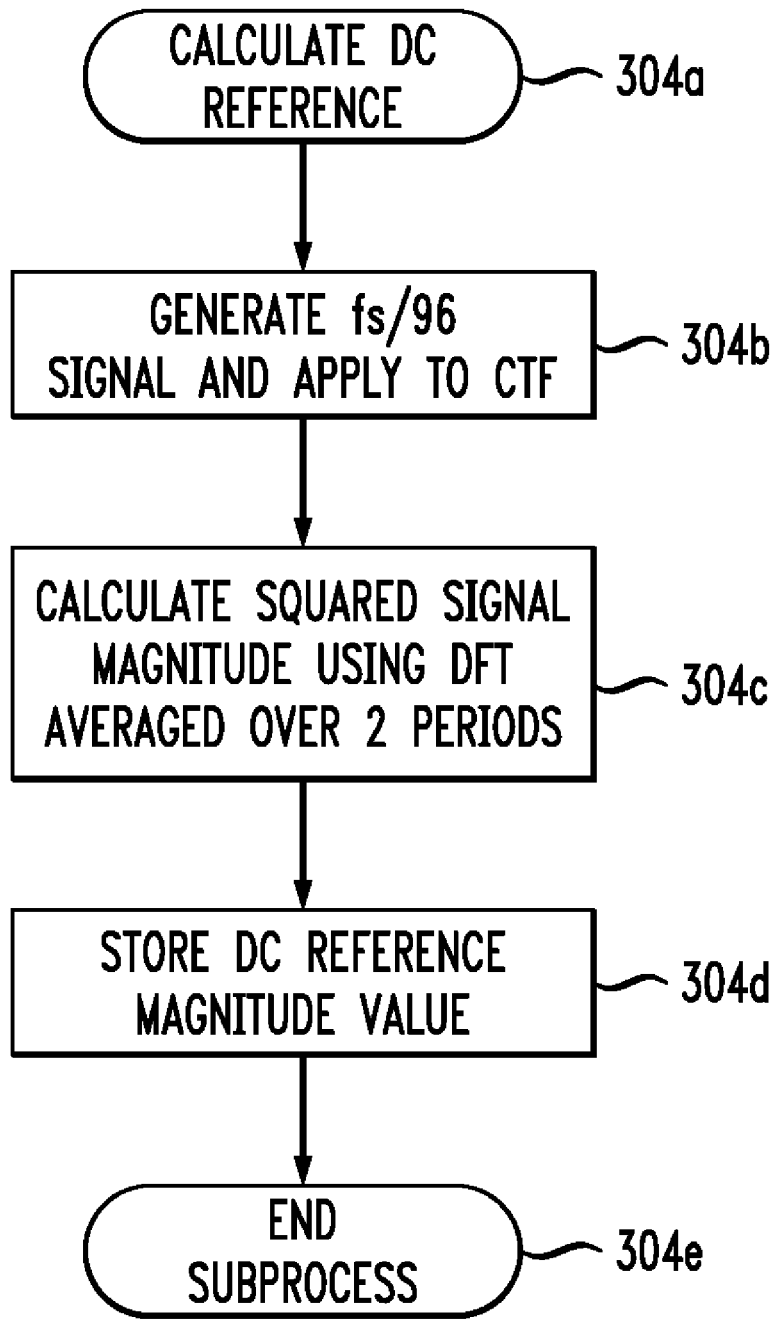

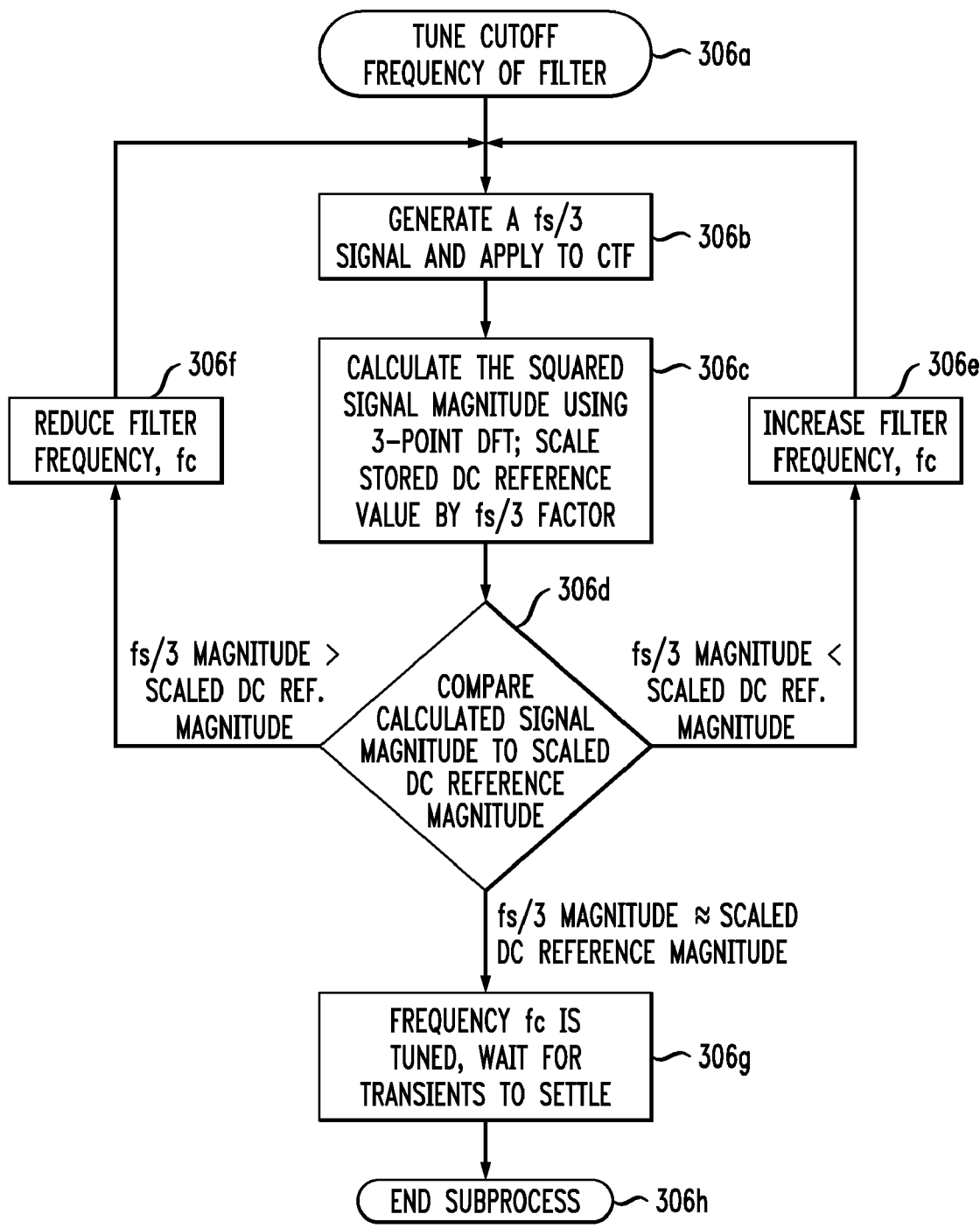

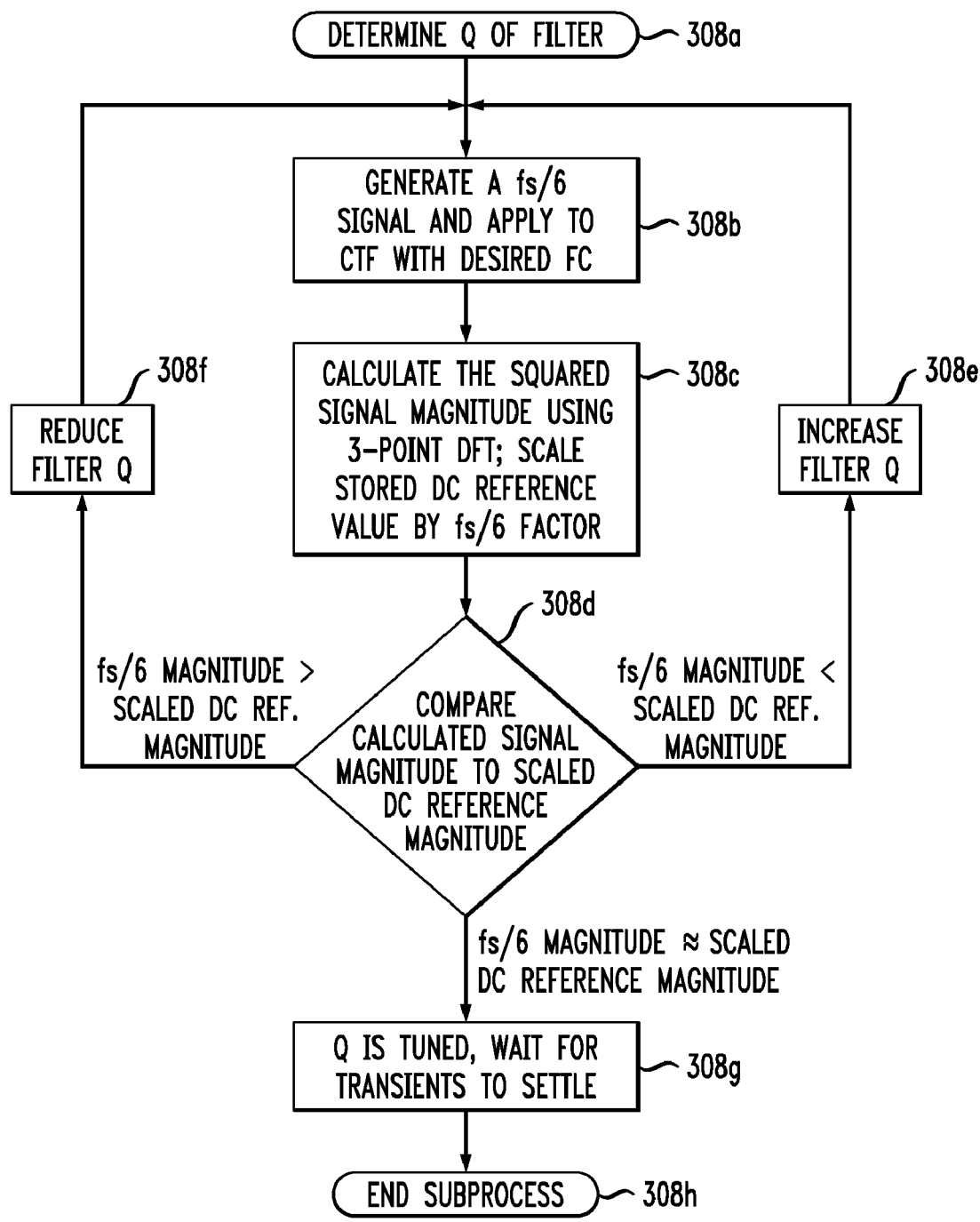

METHOD AND SYSTEM FOR TUNING PRECISION CONTINUOUS-TIME FILTERS

CROSS-REFERENCE TO RELATED APPLICATIONS

The subject matter of this application is related to U.S. patent application Ser. No. 12/337,925 filed on Dec. 18, 2008 the teachings of which are incorporated herein by reference.

BACKGROUND OF THE INVENTION

1. Field of the Invention

The present invention relates to generally to continuous-time filters for signal processing, and, in particular, to a method and system for tuning precision continuous-time filters.

2. Description of the Related Art

Continuous-time filters are commonly used in communications systems, especially high frequency communication systems and magnetic storage read channels. One possible implementation of a high frequency continuous-time filter is a transconductance-capacitance ("Gm-C") filter. A Gm-C filter consists of a transconductance (Gm) element and a capacitor (C). In this example, the transconductance element is characterized by the equation Iout=Gm*Vin, where Iout is the output current, Vin is the input voltage, and Gm is the transconductance or gain of the element. This output current Iout is applied to capacitor C to produce an output voltage. The voltage across capacitor C varies in accordance with the current through the capacitor, and the current through capacitor C varies in accordance with the voltage applied to the transconductor, thus creating a frequency dependent filter.

One type of Gm-C filter is a Gm-C biquadratic ("Gm-C biquad") filter. A Gm-C biquad filter is a second-order recursive linear filter, meaning that its transfer function is the ratio of two quadratic functions and, thus, has two poles and two zeros. Higher-order recursive filters may be implemented using serially cascaded Gm-C biquad filters. Gm-C biquad filters are commonly used in tunable continuous-time bandpass filter applications. An example of such a Gm-C biquad filter can be found in the paper by Uwe Stehr & Frank Henkel, et al., A FULLY DIFFERENTIAL CMOS INTEGRATED 4TH ORDER RECONFIGURABLE GM-C LOWPASS FILTER FOR MOBILE COMMUNICATION, *Proceedings of the 2003 10th IEEE International Conference on Electronics, Circuits and Systems*, Vol. 1, pp. 144-147, (Dec. 14-17, 2003), which is incorporated herein by reference in its entirety.

The parameters of a Gm-C filter can vary with process, voltage and temperature ("PVT") conditions. For instance, the value of Gm is dependent upon operating temperature, process variations such as transistor doping levels, and production variations such as transistor channel width, transistor channel length, etc. Thus, in applications requiring high accuracy, the Gm-C filter must be tuned to take the PVT variations into account to maintain proper cutoff frequency and quality factor of the filter. Existing methods of maintaining accuracy across PVT variations include manual tuning methods, analog tuning loops, and phase/edge rate detection. However, these existing methods can be cumbersome and may not maintain high accuracy.

SUMMARY OF THE INVENTION

In an exemplary embodiment, the present invention provides a method of calibrating a continuous-time filter. The filter has an input, an output, and at least one adjustable parameter. A square-wave signal is provided to the continuous-time filter, which has a cutoff frequency less than fs. The filtered signal is quantized at the rate fs and an N-point Fourier transform is performed of the quantized signal into N real output values and N imaginary output values. At least one of the real output values are accumulated to form a real output signal and at least one of the imaginary output values are accumulated to form an imaginary output signal. The real and imaginary output signals are summed to form an output signal, which is then squared. The squared output signal is compared to a comparison value, and at least one parameter of the continuous-time filter is adjusted based upon the comparison. The steps are repeated until the squared output signal is approximately the comparison value. In this embodiment, the input signal has a frequency of approximately fs/M, and M is an integer multiple of N.

In another exemplary embodiment, the present invention provides another method of calibrating a continuous-time filter. The filter has two adjustable parameters. The filter is tuned by first applying an approximately DC signal to the input of the filter, thus producing a filtered DC signal at the filter output. The magnitude of the filtered DC signal is measured and is stored as the DC reference value. Next, a first signal of a first frequency is applied to the input of the filter to produce a filtered first signal at the filter output. The magnitude of the filtered first signal is measured and the first filter parameter is adjusted until the magnitude of the filtered first signal is approximately a first comparison value. A second signal of a second frequency is then applied to the input of the filter to produce a filtered second signal at the filter output. The magnitude of the filtered second signal is measured and the second filter parameter is adjusted until the magnitude of the filtered second signal is approximately a second comparison value. The first signal of the first frequency is reapplied to the input of the filter and the magnitude of the reapplied filtered first signal is determined. If this magnitude value is not approximately equal to the previously measured magnitude of the first signal of the first frequency, then the tuning process is repeated. In this embodiment, the second frequency is different than the first frequency, and the first comparison value is equal to the DC reference value multiplied by a first scaling factor and the second comparison value is equal to the DC reference value multiplied by a second scaling factor.

In another exemplary embodiment, the present invention provides an apparatus for calibrating a continuous-time filter. This apparatus includes a square-wave signal generator and a continuous-time filter having a cutoff frequency of less than fs for filtering the generated square-wave signals. The apparatus further includes a quantizer sampling the filtered signal at the rate fs and an N-point discrete Fourier transformer for converting the sampled signal into N real output values and N imaginary output values at the rate fs. An accumulator accumulates at least one of the real output values to form a real output signal and an accumulator accumulates at least one of the imaginary output values to form an imaginary output signal. An adder sums the real and imaginary output signals to form an output signal and the output signal is then squared. A comparator compares the squared output signal with a comparison value, and a controller is adapted to adjust at least one parameter of the continuous-time filter based upon the output of the comparator. In this embodiment, the input signal has a frequency of approximately fs/M, and M is an integer multiple of N.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 3 shows a block diagram of an exemplary method for tuning a precision continuous-time filter, in accordance with an embodiment of the present invention;

FIGS. 4a, 4b and 4c show greater detail of some of the steps of the method shown in FIG. 3.

DETAILED DESCRIPTION

As described herein, embodiments of the present invention provide a method and system for tuning a precision continuous-time filter, for example, a dual Gm-C biquad filter.

This application describes different embodiments of the present invention. So as not to obscure the invention, some specific details of the various embodiments that are within the knowledge of a person of ordinary skill in the art may not be discussed herein.

Figure 1:
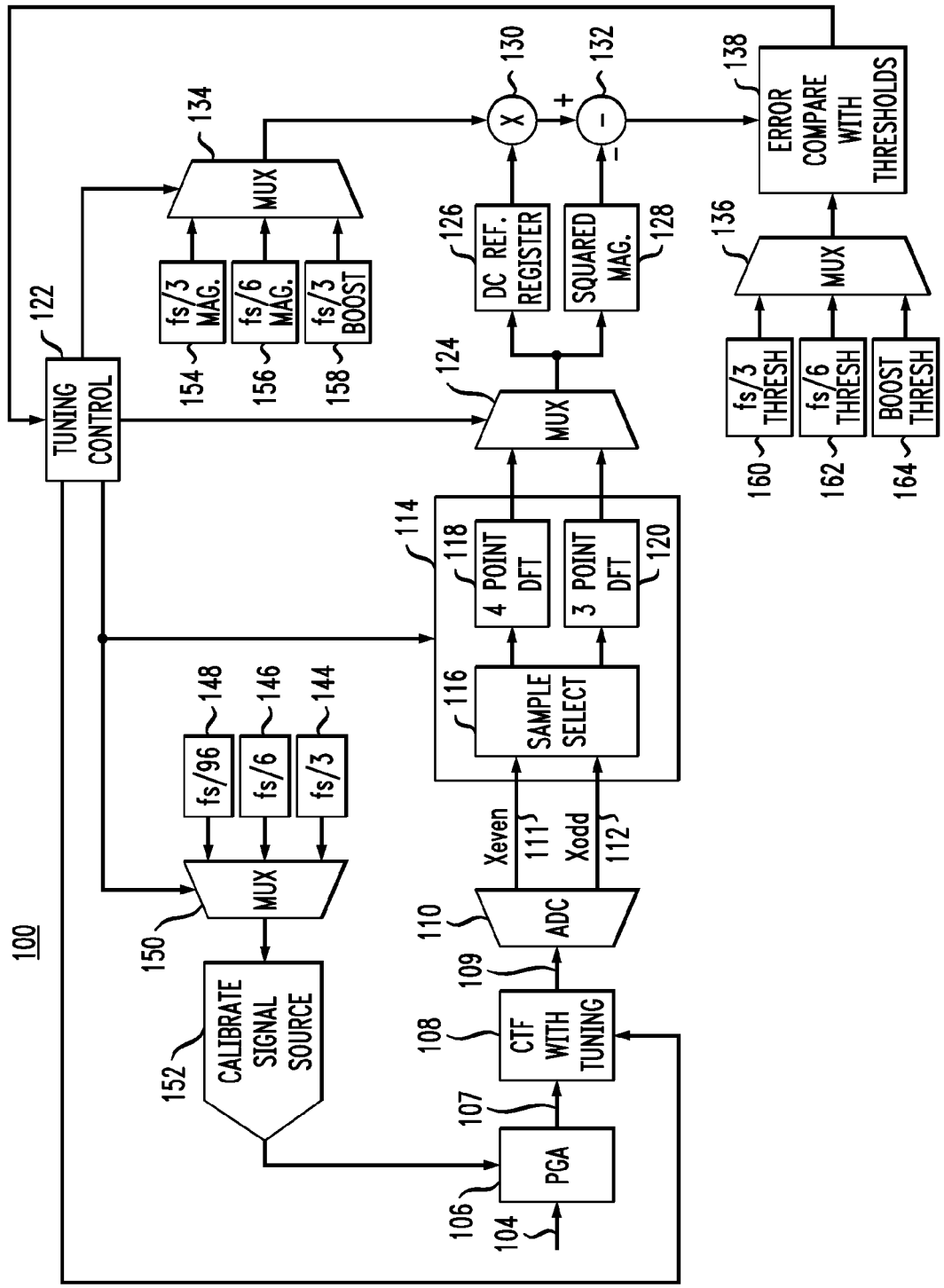
FIG. 1 shows a block diagram of an exemplary tuning circuit for a precision continuous-time filter, in accordance with an embodiment of the present invention.

FIG. 1 shows a block diagram of an exemplary tuning circuit for precision continuous-time filter 100 in accordance with an embodiment of the present invention. While a plurality of multiplexers, registers, multipliers and subtractors are shown as separate blocks in FIG. 1 for ease of description, it will be apparent to one of ordinary skill in the art that such blocks, as described in greater detail below, could be implemented as software and a microprocessor.

In normal operation when a filter calibration is not being performed, an analog input signal on input 104 is provided to programmable gain amplifier ("PGA") 106 and calibration signal source 152 is idle. The output 107 of PGA 106 is provided to a continuous-time filter ("CTF") 108, which will be described in greater detail with respect to FIG. 2. A filtered signal 109 is output from CTF 108 and is provided to quantizer 110. Quantizer 110 samples the output of the CTF at a sample rate fs. In an exemplary embodiment of the present invention, quantizer 110 takes two samples per clock cycle (Xeven and Xodd). In normal operation, magnitude calculation block 114 is idle and the outputs 111 and 112 of quantizer 110 are provided to external circuitry (not shown).

As will be described in more detail below, in the calibration mode, the calibration signal source 152 is active. In one exemplary embodiment, the calibration signal source 152 (for example, a conventional programmable frequency synthesizer) provides a square-wave calibration signal of varying frequencies, shown as calibration signals 144, 146 and 148. One of the calibration signals 144, 146 or 148 is selected by multiplexer 150, under the control of tuning controller 122. In one exemplary embodiment of the invention, tuning controller 122 is a microprocessor, and calibration signals 144, 146 and 148 may be values stored in memory registers in controller 122 and are used to control the frequency of calibration signal source 152.

The calibration signal is provided to programmable gain amplifier 106, which is in electrical communication with CTF 108. An amplifier and filtered calibration signal is output from CTF 108 and is provided to quantizer 110. Quantizer 110 samples the output of the CTF 108, as described above.

The outputs of quanitizer 110 are provided to magnitude calculation block 114 and the connection to external circuitry is idle. Magnitude calculation block 114 comprises sample selection block 116, a 4-point discrete Fourier transform ("DFT") 118 and a 3-point DFT 120. An alternative embodiment of the present invention can be implemented using only 3-point DFT 120. The operation of sample selection block 116, DFT 118 and DFT 120 will be described in greater detail in relation to FIG. 5.

The outputs of DFT 118 and DFT 120 are provided to multiplexer 124. Tuning controller 122 sets multiplexer 124 to select which one of DFT 118 or DFT 120 is in operation during calibration. The selected DFT output is provided to DC reference register 126. The selected DFT output is also squared and provided to squared magnitude register 128. As will be described in greater detail with reference to FIGS. 3, 4a, 4b and 4c, the value stored in DC reference register 126 is scaled by a calibration frequency factor at multiplication block 130. The calibration frequency factor is selected by multiplexer 134, controlled by tuning controller 122. The calibration frequency factors 154, 156 and 158 are values that may be stored in memory registers in controller 122. At subtraction block 132, the value stored in squared magnitude register 128 is then subtracted from the scaled DC reference value. The difference between these values is then compared to a calibration frequency threshold value at threshold comparison block 138. The calibration frequency threshold value is selected by multiplexer 136, controlled by tuning controller 122 (connection not shown). The calibration frequency threshold values 160, 162 and 164 are values that may be stored in memory registers in controller 122. Based upon the result of the threshold comparison at block 138, the cutoff frequency, fc, and the quality factor, Q, of CTF 108 may be adjusted by changing the values that may be stored in memory or registers within controller 122, as discussed in greater detail below. As would be apparent to one skilled in the art, in exemplary embodiments, subtraction block 132 and threshold comparison block 138 may be implemented as software on a microprocessor, which may be the same microprocessor used to implement tuning controller 122.

Figure 2:
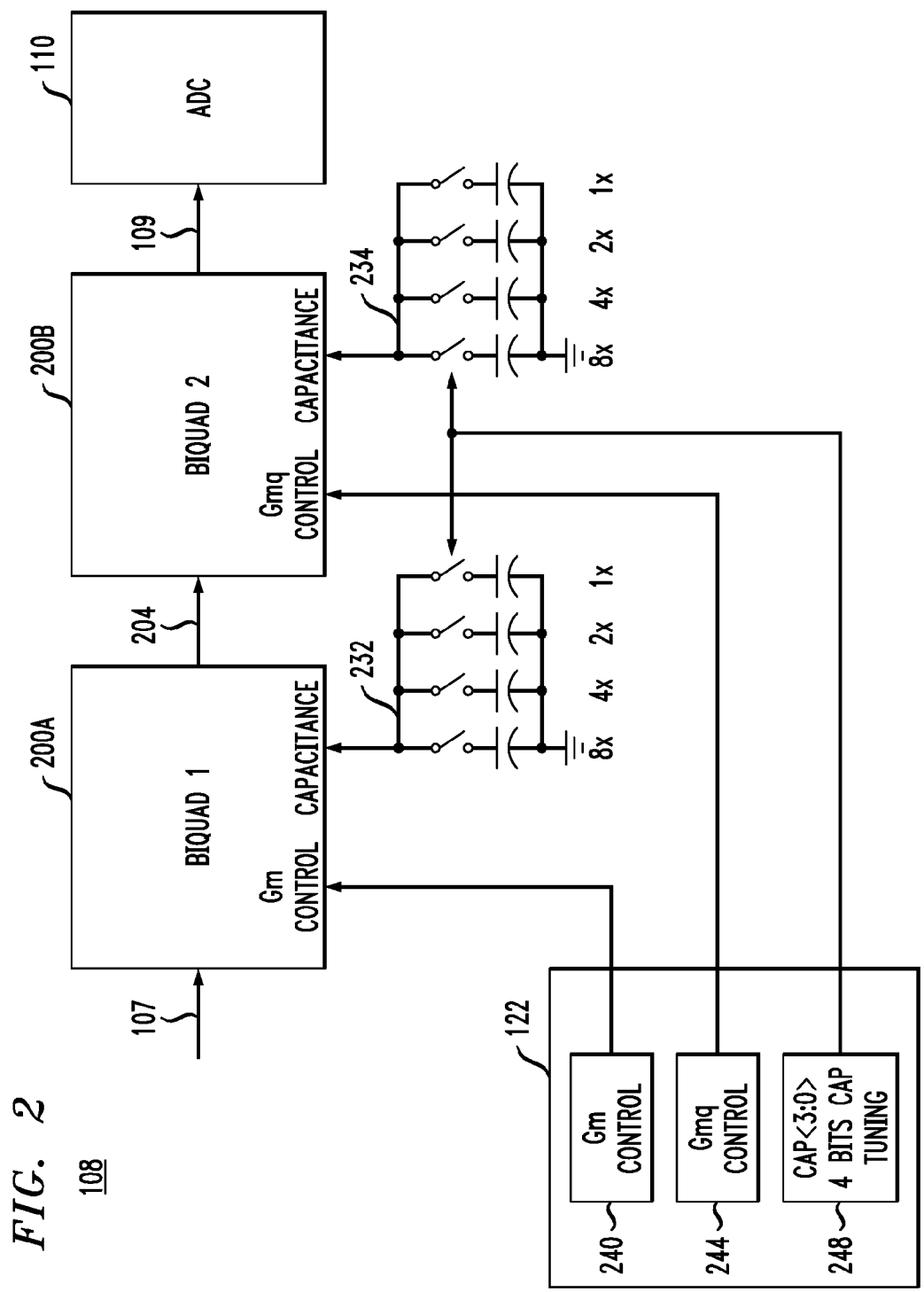
FIG. 2 shows a schematic of an exemplary precision continuous-time filter with tuning control with digital control and controller, in accordance with an embodiment of the present invention.

Now referring to FIG. 2, it is shown a simplified schematic of CTF filter 108, in accordance with an exemplary embodiment of the present invention. As shown, CTF 108 is a conventional low-pass dual Gm-C biquad filter with adjustable tuning parameters. A first biquad filter of CTF 108, a conventional low-pass biquad filter and denoted as biquad 200A, is adapted to primarily determine the cutoff frequency, fc, of CTF 108. A second biquad filter of CTF 108 in tandem with biquad 200A, also a conventional low-pass biquad filter and denoted as biquad 210B, is adapted to primarily determine the Q of CTF 108. As will be described in greater detail below, to tune the cutoff frequency, fc, of CTF 108, the gain, Gm, of biquad 200A and the capacitance of capacitor arrays 232 and 234 are adjusted, and the ratio of Gm and Gmq is held constant so only fc is changed. To tune the Q of CTF 108 to provide peak gain at the desired frequency, the gain of biquad 200B, Gmq, is adjusted, and the ratio of Gm and Gmq is no longer fixed. It is understood that other types of filters may be used for CTF 108, such as high-pass filters, and may be implemented using, for example, Chebyshev or Butterworth configurations.

As shown in FIG. 2, biquad 200A is in electrical communication with tuning controller 122 (FIG. 1) and binary-weighted capacitor array 232. Tuning controller 122 includes the Gm control register 240 which controls the value of the gain, Gm, of biquad 200A. Tuning controller 122 also includes CAP register 248, which controls the value of the capacitor arrays 232 and 234. As shown in FIG. 2, capacitor arrays 232 and 234 share a common control line but, as would be apparent to one skilled in the art, capacitor arrays 232 and 234 may be independently controlled. Capacitor arrays 232 and 234 each comprise four capacitance values that can be switched into the circuit, based upon the value of the CAP register 248. In an exemplary embodiment the values of capacitor arrays 232 and 234 are held in a substantially fixed ratio to each other. In one embodiment, the values of capacitor arrays 232 and 234 are substantially equal. Biquad 200B is in electrical communication with timing controller 122 and binary-weighted capacitor array 234. Tuning controller 122 includes the Gmq control register 244, which controls the value of the gain, Gmq, of biquad 200B.

As would be apparent to one of skill in the art, the gain of a conventional Gm-C biquad filter may be adjusted by several means, including by changing the transconductor current in the filter, changing the reference voltage to the transconductors, or by adding additional gain stages. In an exemplary embodiment of the present invention, the gain, Gm, of biquad 200A, is determined by a variable current source Idac (not shown), where Gm=Idac/Vref, and Vref is the reference voltage of the transconductors of biquad 200A and is approximately equal to 80 mV in one embodiment. The output of the variable current source Idac is controlled by the setting of the Gm control register 240. During the step of tuning the cutoff frequency of CTF 108, described in more detail with regard to FIGS. 3 and 4, the gain, Gmq, of biquad 200B is held in an approximately fixed ratio with the gain, Gm, of biquad 200A. This ratio is determined by the equation Gmq=(Gm*Vref)/Vrefq, where Vrefq is the reference voltage of the transconductors in biquad 200B, and in this embodiment, Vref is a substantially fixed voltage.

To set the highest frequency, fc, of CTF 108, variable current source Idac is set to output the maximum current by changing the value stored in the Gm control register 240. When Idac is at its maximum, both biquads are at their maximum gain due to Gm and Gmq being held in a fixed ratio. The 4-bit CAP register 248 will be set so that none of the capacitors in arrays 232 and 234 are switched into the circuit, leaving only parasitic capacitance and any associated fixed capacitance in the circuit and, thus, the capacitance in the circuit is at its minimum vale. Therefore, with maximum Idac and minimum capacitance, fc is at its maximum value.

To lower fc, Idac is lowered by changing the setting of Gm control register 240, and additional capacitors are switched in to increase the capacitance of arrays 232 and 234 by changing the setting of the 4-bit CAP register 248. By lowering Idac, the gain of the transconductors of biquad 200A is reduced. During frequency tuning, the ratio of Gm to Gmq is held approximately constant to avoid changing the Q of CTF 108 when changing fc. Thus, the value of Gmq will track the value of Gm during frequency timing of CTF 108. As would be apparent to one of skill in the art, a table showing the filter frequency and the corresponding settings for the Gm control and CAP registers could be constructed. In an exemplary embodiment of the filter, fc can be tuned from 270 MHz to 1.28 GHz.

To set the filter Q value, the value of the Gmq control register 244 is changed while leaving Gm and the capacitance of arrays 232 and 234 unchanged. During Q tuning of CTF 108, the ratio of Gm to Gmq is not held constant. The value of Gmq control register 244 changes the reference voltage, Vrefq, of the transconductors in biquad 200B. An increase in Vrefq corresponds to a decrease in Gmq, which in turn corresponds to an decrease in the Q of the filter. In an exemplary embodiment of the filter, Q can be tuned from 0.9 to 2.8.

FIG. 3 shows an exemplary block diagram of calibration sequence 300, a method for tuning a precision continuous-time filter in accordance with an exemplary embodiment of the present invention. Step 302 shows that the calibration sequence 300 operates in idle mode until a calibration is needed. For example, calibration could be run on power-up of the system, or at intervals during system operation to calibrate for PVT (Process, Voltage, Temperature) variations over time. Further, it would be appreciated by one skilled in the art that an incomplete calibration may be resumed at the start of the last completed step in the calibration sequence to avoid starting over completely.

At step 304, a DC reference signal is determined that is used as a reference to compare the other signal values during calibration. Given that the determined DC reference value is stored in memory, step 304 need not be repeated every time the calibration sequence is done, as indicated by dashed line 320. As shown in greater detail in FIG. 4a, the DC reference signal magnitude is determined by generating a square-wave calibration signal of a sufficiently low frequency to approximate a DC signal and applying the calibration signal to the input of CTF 108 at step 304b. In an exemplary embodiment of the present invention, the frequency of the square-wave calibration signal is approximately equal to Is/96, where fs is the sampling frequency of quantizer 110. Thus, when fs is equal to 3.6 GHz, the "DC" reference signal frequency is approximately 37.5 MHz, which is sufficiently close to a DC signal when compared to fs.

At step 304c, the squared signal magnitude of the filtered DC reference signal is determined. As described above in relation to FIG. 1, the filtered DC reference signal is sampled by quantizer 110. The outputs of quantizer 110 are provided to sample selection block 116 and a 4-point discrete Fourier transform ("DFT") 118 and a 3-point DFT 120. The output of the selected DFT is squared and summed to approximate the magnitude of the filtered reference signal. Because 96 is a multiple of both 3 and 4, either the 3-point 120 or the 4-point DFT 118 may be used. At step 304d, the calculated DC reference magnitude is stored to DC reference register 126. As would be apparent to one of skill in the art, other multiples of 3 or 4 may be used (e.g. 24).

Now referring back to FIG. 3, at step 306, the unboosted cutoff frequency, fc, of the filter is tuned. In this step, the initial Q value of the filter is not known, and is assumed to be equal to 0.707. As described above with regard to FIG. 2, in step 306, the gain of biquad 200A and the values of capacitance arrays 232 and 234 will be adjusted to affect the cutoff frequency of the filter. Further, the gain, Gm, of biquad 200A, and the gain, Gmq, of biquad 200B will be held in a fixed ratio during frequency tuning of CTF 108.

As shown in greater detail in FIG. 4b, the unboosted cutoff frequency is tuned by generating a cutoff frequency calibration signal at step 306b and applying the signal to CTF 108. In an exemplary embodiment, the cutoff frequency calibration signal has a frequency approximately equal to fs/3. Thus, when fs is equal to 3.6 GHz, fs/3 is equal to 1.2 GHz. The frequency fs/3 was chosen because it provides a reasonable amount of signal attenuation while still providing a sample with adequate significant bits, but other frequencies may be used.

At step 306c, the squared signal magnitude of the filtered fs/3 reference signal is determined. As described above in relation to FIG. 1, the filtered fs/3 reference signal is sampled by quantizer 110. The outputs of quantizer 110 are provided to sample selection block 116 and tuning controller 122 activates multiplexer 124 to select the output of 3-point DFT 120. The output of DFT 120 is squared and summed to approximate the magnitude of the filtered reference signal. The calculated fs/3 reference magnitude is stored to squared magnitude register 128.

At step 306d, the stored fs/3 reference magnitude is compared to the stored DC reference magnitude, multiplied by a calibration frequency factor, shown as 154, 156 and 158 in FIG. 1. The calibration frequency factor for the fs/3 calibration frequency is selected by multiplexer 134. The difference between the fs/3 reference magnitude and the scaled DC reference value is compared to a calibration frequency threshold value, shown as 160, 162 and 164 in FIG. 1. The calibration frequency threshold value for the fs/3 calibration frequency is selected by multiplexer 136. The calibration frequency factors threshold values are based upon the expected values for each calibration frequency, shown as 144, 146 and 148 in FIG. 1.

If the fs/3 reference magnitude is approximately equal to the scaled DC reference magnitude, the filter cutoff frequency is tuned, and processing moves to step 306g, where there is a delay to allow transients to settle before ending the cutoff frequency tuning subprocess at step 306h. If the fs/3 reference magnitude is less than the scaled DC reference magnitude, the filter cutoff frequency is too low and must be increased at step 306e. If the fs/3 reference magnitude is greater than the scaled DC reference magnitude, the filter cutoff frequency is too high and must be reduced at step 306f. As described above, the cutoff frequency of CTF 108 may be adjusted by changing the values stored in fc adjust register 140 (FIG. 2). Once fc is increased or reduced at step 306e or 306f, respectively, the tuning process returns to step 306b. The process will continue as described above until the fs/3 reference magnitude is approximately equal to the scaled DC reference magnitude, and the filter cutoff frequency is tuned.

Returning to FIG. 3, since the actual value of Q is not known at step 306, the value of Q is determined at step 308. If the Q value of the filter is actually 0.707 as assumed during step 306, the filter should have a flat frequency response. As shown in greater detail in FIG. 4c, the flatness of the frequency response is calibrated by generating a Q calibration signal at step 308b and applying the signal to CTF 108. In an exemplary embodiment, the Q calibration signal has a frequency approximately equal to fs/6. Thus, when fs is equal to 3.6 GHz, fs/6 is equal to 600 MHz. If the filter response is approximately the same at fs/3 and fs/6, then the filter frequency response may be presumed to be sufficiently flat.

Referring back to FIG. 3, adjusting Q in step 308 can affect the cutoff frequency that was tuned in step 306 since it is the ratio of the different Gm values that define the filter response. If Q is adjusted at step 308, it is necessary to go back to step 306 to re-adjust the cutoff frequency, as shown by dashed line 322 in FIG. 3. After step 306 is performed, step 308 is always performed to insure the Gm ratio is correct. Thus, steps 306 and 308 are an iterative process until the desired flat frequency response with the proper cutoff frequency. Without performing tuning steps 306 and 308, the cutoff frequency of the filter may be correct, but the peak boost frequency could be at the wrong point in the frequency response curve.

At step 310, the overall gain of the filter is adjusted to provide peak gain at the operating frequency of the filter. The boost peak for this filter type is at approximately fs/3, which is another reason why that frequency was chosen. The adjusting in step 310 is substantially the same as in step 308, but with a different target magnitude value. In step 310, the goal is to provide the maximum gain at the operating frequency of the filter. Since the overall frequency response shape was tuned in steps 306 and 308, step 310 need be performed only once. In step 310, the gain, Gmq, of biquad 200B is controlled by Gmq control register 244 and the gain, Gm, of biquad 200A, and the gain, Gmq, of biquad 200B are no longer held in a fixed ratio.

Figure 5:
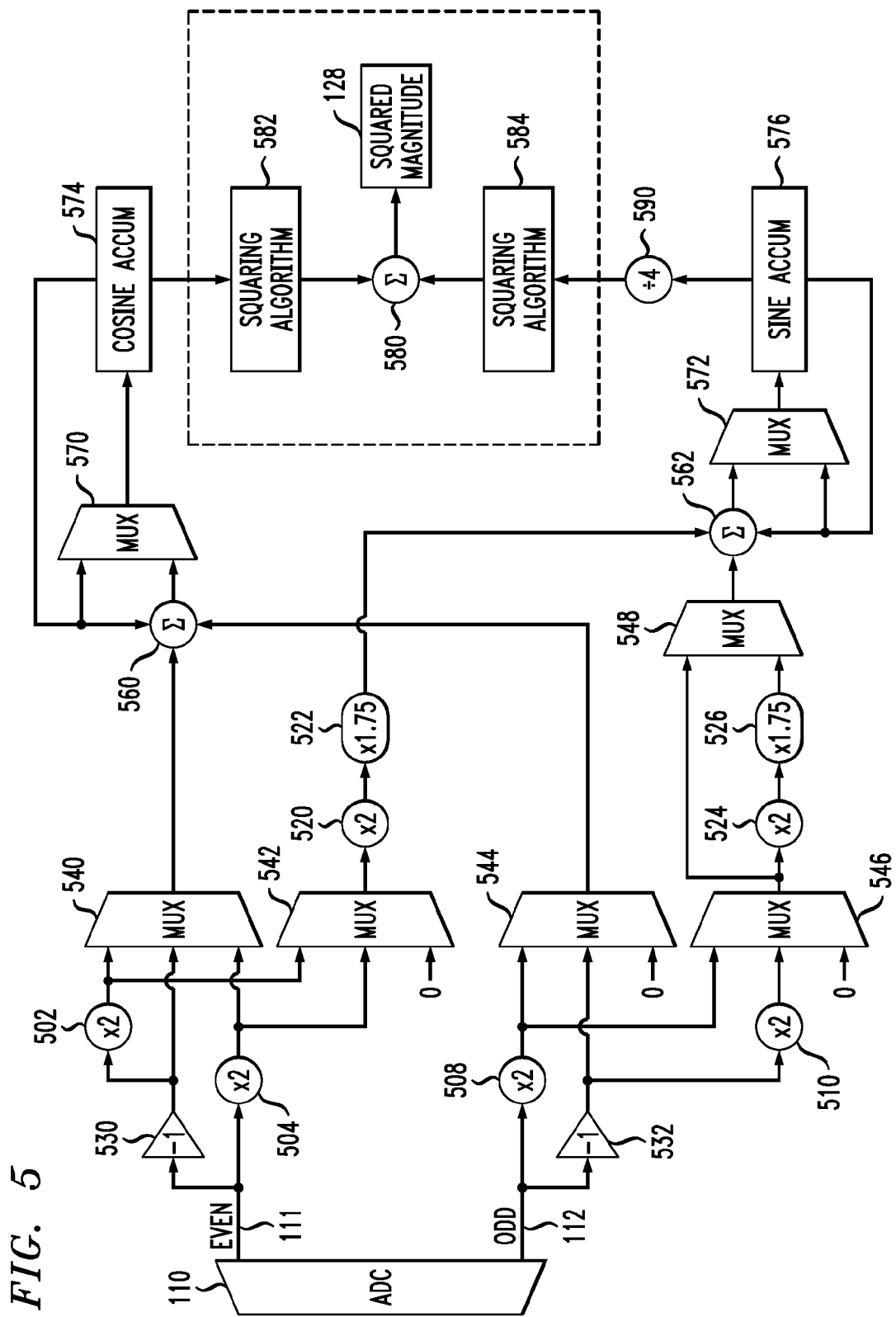
FIG. 5 shows a block diagram of a Discrete Fourier Transform circuit, in accordance with an exemplary embodiment of the present invention.

FIG. 5 shows an exemplary block diagram of the Discrete Fourier Transform ("DFT") circuit 114 (FIG. 1) in accordance with another exemplary embodiment of the present invention. The exemplary embodiment shown in FIG. 5 implements both a 3-point DFT and a 4-point DFT. Because the 3-point DFT and the 4-point DFT share the same hardware, as shown in FIG. 5, minimal physical space is used, and either the 3-point DFT or the 4-point DFT may be selected to be active, for example by controller 122. The DFT is characterized by the equation:

$$H(j\omega) = \sum_{k=0}^{YP} r[k]\left(\cos\left(\frac{k2\pi}{P}\right) - j\sin\left(\frac{k2\pi}{P}\right)\right),$$

where P is the number of points in the DFT and Y is the number of periods to accumulate.

In an exemplary embodiment, the 3-point DFT 120 can be implemented by taking six samples from quantizer 110. Quantizer 110 takes two samples every sample clock cycle, Xeven (output 111) and Xodd (output 112), so three clock cycles are necessary to take six samples. The sine and cosine terms of the DFT equation are then calculated for each sample. The unscaled sine and cosine terms are shown in table 1 below:

TABLE 1

| Period | sample(k) | cos(2π * k/3) | sin(2π * k/3) |
|---|---|---|---|
| 1 | Xeven(0) | 1 | 0 |
| 1 | Xodd(1) | −0.5 | 0.866 |
| 2 | Xeven(2) | −0.5 | −0.866 |
| 2 | Xodd(3) | 1 | 0 |
| 3 | Xeven(4) | −0.5 | 0.866 |
| 3 | Xodd(5) | −0.5 | −0.866 |

However, in order to maintain sample accuracy, the sine and cosine terms shown in Table 1 are scaled by one or more scaling factors. In an exemplary embodiment, the cosine terms are scaled up by a factor of two and the sine terms are scaled up by a factor of eight. For the cosine terms, for example, scaling tip by a factor of 2 (left shift one bit) prevents losing the least significant bit (LSB) when multiplying by 0.5 (right shift one bit). For the sine terms, for example, instead of the 0.866 term as shown in table 1, a multiplier of 0.875 was chosen for easier implementation. Further, because the scaling of the sine terms should match the scaling of the cosine terms, the multiplier should be scaled up by a factor of 2 (0.875*2=1.75), shown as multipliers 522 and 526. In order to prevent the least significant bits being lost during DFT calculations, the sine terms are scaled up by an additional factor of 4 (left shift 2 bits). Then, once DFT calculations are complete, the accumulated sine terms could be divided by 4 (right shift 2 bits) and, thus, match the 2 times scaling factor of the cosine terms. Thus, in an exemplary embodiment, the terms in Table 1 are scaled as shown in Table 1A below:

TABLE 1A

| Period | sample(k) | cos(2π * k/3) | sin(2π * k/3) |
|---|---|---|---|
| 1 | Xeven(0) | 2 | 0 |
| 1 | Xodd(1) | −1 | 7 |
| 2 | Xeven(2) | −1 | −7 |
| 2 | Xodd(3) | 2 | 0 |
| 3 | Xeven(4) | −1 | 7 |
| 3 | Xodd(5) | −1 | −7 |

To calculate the cosine terms, in the first period of the sample clock cycle, Xeven(0) is multiplied by 2. The multiply by 2 (left shift one bit) is represented by multiplier 504 in FIG. 5. The shifted value is then added to the two's complement of the Xodd(1) sample. The two's complement is represented by inverter 532. In the second period of the clock cycle, multiplexers 540 and 544 change so that the Xeven(2) sample is negated by inverter 530 and the Xodd(3) sample is multiplied by 2 by multiplier 508. In the third period, multiplexers 540 and 544 change again so that the Xeven(4) and the Xodd(5) samples are negated by inverter 530 and 532, respectively. On each cycle, the selected output terms are summed by adder 560 and accumulated in the cosine accum register 574. This three period cycle may be repeated some number of times to get an average. The multiplexers 540, 542, 544 and 546 of the 3-point DFT are controlled by a counter (not shown) that counts 0, 1, 2. As would be apparent to one skilled in the art, in exemplary embodiments, the counter may be implemented as software on a microprocessor, which may be the same microprocessor used to implement tuning controller 122 (FIG. 1).

Similarly as discussed above for the cosine terms, multiplexers 542 and 546 change on each clock cycle to determine which sample is selected. In period 1, multiplexer 542 selects the 0 input to be multiplied with Xeven(0). Multiplexer 546 selects the non-inverted Xodd(1) sample from multiplier 508, which is then multiplied at blocks 524 and 526 and selected by multiplexer 548 to achieve a total multiplier of 7. In period 2, multiplexer 542 selects the Xeven(2) sample that is inverted by 530 and multiplied by 502, which is then multiplied at 520 and 522 to achieve a total multiplier of −7. Multiplexer 546 selects the 0 input to be multiplied with Xodd(3). In period 3, multiplexer 542 selects the Xeven(4) sample that is non-inverted from multiplier 504, which is then multiplied at 520 and 522 to achieve a total multiplier of 7. Multiplexer 546 selects the inverted Xodd(5) sample from multiplier 510, which is then multiplied at blocks 524 and 526 and selected by multiplexer 548 to achieve a total multiplier of −7. On each cycle, the selected output terms are summed by adder 562 and accumulated in the sine accum register 576. The resulting accumulated sine terms are then rescaled at divider 590 to match the scaling of the accumulated cosine terms.

The resulting accumulated cosine terms and the rescaled accumulated sine terms are then squared by squaring algorithms 582 and 584, respectively. The squared terms are summed by adder 580 to provide the final squared magnitude value, which is stored in the squared magnitude register 128. The DFT terms may be accumulated over numerous sample periods to generate an average value.

In an exemplary embodiment, the 4-point DFT 118 can be implemented by taking four samples from quantizer 110. As shown in FIG. 5, in an exemplary embodiment both the 3-point and the 4-point DFT are implemented by one circuit, therefore, the sine and cosine terms of the 4-point DFT shown in Table 2 may also be scaled up by one or more scaling factors to correspond to the scaling of the sine and cosine terms of the 3-point DFT described above. In an exemplary embodiment, the samples are multiplied by 2 to match the 3-point DFT for absolute magnitude. Quantizer 110 takes two samples every sample clock cycle, Xeven and Xodd, so two sample clock periods are necessary to take four samples. The sine and cosine terms are then calculated for each sample. The scaled sine and cosine terms are shown in Table 2 below:

TABLE 2

| Period | sample(k) | cos(2π * k/4) | sin(2π * k/4) |
|---|---|---|---|
| 1 | Xeven(0) | 2 | 0 |
| 1 | Xodd(1) | 0 | 2 |
| 2 | Xeven(2) | −2 | 0 |
| 2 | Xodd(3) | 0 | −2 |

This pattern repeats every two sample clock periods and does not require the additional multiplication of the 3-point DFT since the only terms are 2 and −2. Multiplexer 548 is thus configured to bypass multipliers 524 and 526 for the 4-point DFT. The sine and cosine terms are calculated in the same way as described above with regard to the 3-point DFT, with multiplexers selecting the proper terms, but the 4-point DFT only needs a counter (not shown) controlling multiplexers 540, 542, 544, and 546 that counts 0, 1.

For calculations with the lower frequencies such as fs/6 and fs/96, Xeven and Xodd are downsampled by skipping the appropriate number of samples and performing the same DFT algorithms described above. As would be apparent to one of skill in the art, any frequency that is generally evenly divisible by 3 or 4 may be used with the 3-point and 4-point DFT algorithms, respectively. This downsampling is shown in FIG. 1 as sample select 116, and as multiplexers 570 and 572 in FIG. 5. Multiplexers 570 and 572 are controlled by a third counter that controls when to accumulate the samples. The downsampling rate is approximately equal to the ratio of the calibration frequencies. For example, using fs/3 and fs/6 as the frequencies for calibration signals 144 and 146 (FIG. 1), allows the downsampling rate to be equal to 2.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general-purpose computer.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any maimer known in the art or later developed in which energy is allowed to be transferred between two or more elements, and the interposition of one or more additional elements is contemplated, although not required. Conversely, the terms "directly coupled," "directly connected," etc., imply the absence of such additional elements.

We claim:

1. A method of calibrating a continuous-time filter having at least one adjustable parameter, comprising the steps of:
   a) providing a square-wave signal;
   b) filtering the signal with a continuous-time filter having a cutoff frequency less than fs:
   c) quantizing the filtered signal at the rate fs;
   d) performing an N-output Fourier transform of the quantized signal into N real output values and N imaginary output values at the rate fs;
   e) accumulating at least one of the real output values to form a real output signal:
   f) accumulating at least one of the imaginary output values to form an imaginary output signal;
   g) summing the real and imaginary output signals to form an output signal:
   h) squaring the output signal:
   i) comparing the squared output signal to a comparison value;
   j) adjusting at least one parameter of the continuous-time filter based upon the comparison: and
   k) repeating steps a)-j) until the squared output signal is approximately the comparison value;
   wherein the input signal has a frequency of approximately fs/M, and M is an integer multiple of N.

2. The method of claim 1, wherein the continuous-time filter is a multi-stage transconductance-capacitance (Gm-C) biquad filter.

3. The method of claim 1, wherein the continuous-time filter has a cutoff frequency (fc) and a quality factor (Q), a first adjustable parameter substantially determining the cutoff frequency of the continuous-time filter and a second adjustable parameter substantially determining the quality factor (Q) of the continuous-time filter.

4. The method of claim 2, wherein the transconductance of a first biquad filter and the transconductance of a second biquad filter are held in a substantially fixed ratio during the step of adjusting at least one parameter of the filter.

5. The method of claim 1, wherein the cutoff frequency of the continuous-time filter is less than or equal to approximately fs/(3M).

6. The method of claim 1, wherein M and N are greater than two.

7. The method of claim 1, wherein before the quantized signal is transformed by the Fourier transform, the quantized samples are down-sampled by a rate S, and wherein S is an integer and M equals S times N.

8. A method of calibrating a continuous-time filter having an input, an output, and first and second adjustable parameters, comprising the steps of:
   a) applying an approximately DC signal to the input of the filter to produce a filtered DC signal at the output thereof;
   b) measuring the filtered DC signal to determine a magnitude thereof;
   c) storing the magnitude of the filtered DC signal as a DC reference value;
   d) applying a first signal of a first frequency to the input of the filter to produce a filtered first signal at the output thereof;
   e) measuring the filtered first signal to determine a magnitude thereof;
   f) adjusting the first filter parameter until the magnitude of the filtered first signal is approximately a first comparison value;
   g) applying a second signal of a second frequency to the input of the filter to produce a filtered second signal at the output thereof;
   h) measuring the filtered second signal to determine a magnitude thereof;
   i) adjusting the second filter parameter until the magnitude of the filtered second signal is approximately a second comparison value;
   j) reapplying the first signal of the first frequency to the input of the filter;
   k) measuring the reapplied filtered first signal to determine a magnitude thereof; and
   l) if the magnitude of the reapplied first filtered signal as measured in step k) is not approximately equal to the first value, then repeating steps d) through i);
   wherein, the second frequency is different from the first frequency, the first comparison value of step f) is equal to the DC reference value multiplied by a first scaling factor and the second comparison value of step i) is equal to the DC reference value multiplied by a second scaling factor.

9. The method of claim 8, wherein, in step l), steps d) through i) are repeated until, in steps c) and f), no substantial change is made to the first and second parameters, respectively.

10. The method of claim 8, wherein the continuous-time filter has a cutoff frequency (fc) and a quality factor (Q), the first adjustable parameter substantially determining the cutoff frequency of the continuous-time filter and the second adjustable parameter substantially determining the quality factor (Q) of the continuous-time filter.

11. The method of claim 10, wherein the continuous-time filter is a multi-stage biquad filter comprising a first transconductance-capacitance (Gm-C) biquad filter and a second transconductance-capacitance (Gm-C) biquad filter in tandem with the first biquad filter, the first filter parameter being the first filter transconductance and the second filter parameter being the second filter transconductance, wherein the first biquad filter capacitance and the second biquad filter capacitance are in a substantially fixed ratio.

12. The method of claim 11, wherein the first filter parameter further comprises a capacitance setting of the first biquad filter, wherein the capacitance setting of the first biquad filter and a capacitance setting of the second biquad filter are held in a substantially fixed ratio during the step of adjusting the first filter parameter.

13. The method of claim 11, wherein the transconductance of the first biquad filter and the transconductance of the second biquad filter are held in a substantially fixed ratio during the step f) of adjusting the first filter parameter.

14. The method of claim 8, wherein each of the steps e) and h;) of measuring the magnitude of the first and second filtered signals, respectively, comprises the steps of:
   quantizing the filtered signal at a sampling rate fs to produce a sampled filtered output signal;
   transforming the sampled filtered output signal using an N-point discrete Fourier transform-, to generate, at a rate fs, a real output component and an imaginary output component;
   accumulating the real output components of the transform over X sample clock periods;
   accumulating the imaginary output components of the transform over X sample clock periods;

squaring the accumulated real output components of the discrete Fourier transform;

squaring the accumulated imaginary output components of the discrete Fourier transform; and summing the squared real output components and the squared imaginary output components to produce a squared output magnitude value, wherein X is an integer greater than or equal to 1, N is an integer greater than or equal to 2 and the sample clock period is equal to $1/f_s$.

15. The method of claim 14, wherein N is equal to 3.

16. The method of claim 14, wherein N is equal to 4.

17. The method of claim 14, wherein the filter has a cutoff frequency less than or equal to $f_s/2$.

18. The method of claim 14, wherein the first and second signals are square waves, the first frequency is approximately $f_s/N$, and the filter has a cutoff frequency of less than $f_s/(3N)$.

19. The method of claim 18, wherein the second frequency is approximately $f_s/M$, where M is an integer multiple of N.

20. An apparatus for calibrating a continuous-time filter having at least one adjustable parameter, comprising:

a) a generator adapted to produce square-wave signal;

b) a continuous-time filter, adapted to filter the square-wave signal, having a cutoff frequency of less than $f_s$ and a quality factor;

c) a quantizer adapted to sample the filtered signal at the rate $f_s$;

d) an N-point discrete Fourier transformer adapted to convert the sampled signal into N real output values and N imaginary output values at the rate $f_s$;

e) an accumulator to accumulate at least one of the real output values to form a real output signal;

f) an accumulator to accumulate at least one of the imaginary output values to form an imaginary output signal;

g) a adder to sum the real and imaginary output signals to form an output signal;

h) a squarer to square the output signal;

i) a comparator to compare the squared output signal with a comparison value; and j) a controller adapted to adjust, in response to the output of the comparator, at least one of the cutoff frequency and quality factor of the continuous-time filter;

wherein the square-wave signal has a frequency of approximately $f_s/M$, and M is an integer multiple of N.

* * * * *